(12) United States Patent
Dai et al.

(10) Patent No.: US 7,972,877 B2
(45) Date of Patent: Jul. 5, 2011

(54) FABRICATING METHOD OF LIGHT EMITTING DIODE PACKAGE

(75) Inventors: Ming-Ji Dai, Chiayi County (TW); Chun-Kai Liu, Taipei (TW); Chih-Kuang Yu, Chiayi (TW)

(73) Assignee: Industrial Technology Research Institute, Hsinchu (TW)

( * ) Notice: Subject to any disclaimer, the term of this patent is extended or adjusted under 35 U.S.C. 154(b) by 219 days.

(21) Appl. No.: 12/489,445

(22) Filed: Jun. 23, 2009

(65) Prior Publication Data

US 2009/0258449 A1  Oct. 15, 2009

Related U.S. Application Data

(62) Division of application No. 11/309,041, filed on Jun. 13, 2006, now Pat. No. 7,586,125.

(30) Foreign Application Priority Data

Feb. 20, 2006 (TW) ................................ 95105618 A

(51) Int. Cl.
*H01L 21/00* (2006.01)
(52) U.S. Cl. .............. 438/22; 438/24; 257/E27.008; 257/81; 257/99; 136/201; 136/203; 372/38.1
(58) Field of Classification Search ........... 257/E21.499, 257/E33.056, E27.008, 794, 717, 712, 99, 257/80, 81, 706, 77; 165/80.2; 62/3.2; 136/201, 136/203, 204, 237, 236.1, 241; 372/38.1, 372/34; 438/26, 22, 24, 46, 47
See application file for complete search history.

(56) References Cited

U.S. PATENT DOCUMENTS

| | | | | |
|---|---|---|---|---|
| 5,233,622 | A | * | 8/1993 | Iwamoto ........................ 372/34 |
| 5,724,818 | A | * | 3/1998 | Iwata et al. .................... 62/3.7 |
| 5,874,775 | A | * | 2/1999 | Shiomi et al. ................. 257/712 |
| 6,233,944 | B1 | * | 5/2001 | Yamada et al. ................ 62/3.7 |
| 6,721,341 | B2 | * | 4/2004 | Aikiyo et al. .................. 372/36 |
| 6,893,902 | B2 | * | 5/2005 | Cordes et al. ................. 438/122 |
| 7,517,114 | B2 | * | 4/2009 | Tain et al. ..................... 362/294 |
| 7,633,154 | B2 | * | 12/2009 | Dai et al. ....................... 257/712 |
| 7,638,705 | B2 | * | 12/2009 | Venkatasubramanian .... 136/206 |
| 2005/0156531 | A1 | | 7/2005 | Young |

OTHER PUBLICATIONS

"Office Action of Taiwan Counterpart Application", issued on Jan. 12, 2011, p. 1-p. 8, in which the listed references were cited.

* cited by examiner

*Primary Examiner* — Chris Chu
(74) *Attorney, Agent, or Firm* — Jianq Chyun IP Office

(57) ABSTRACT

A method of fabricating a light emitting diode package structure is provided. First, a first circuit substrate having a first surface and a corresponding second surface and a second circuit substrate having a third surface and a corresponding fourth surface are provided. The second surface and the third surface respectively have a plurality of electrodes. Then, a plurality of N-type semiconductor materials and a plurality of P-type semiconductor materials alternatively arranged on the electrodes are formed. Then, the first circuit substrate and the second circuit substrate are assembled. The two type semiconductor materials are located between the electrodes of the first circuit substrate and the second circuit substrate. The two type semiconductor materials are electrically connected to the first circuit substrate and the second circuit substrate through the electrodes. Finally, an LED chip is arranged on the first surface and electrically connected to the first circuit substrate.

28 Claims, 17 Drawing Sheets

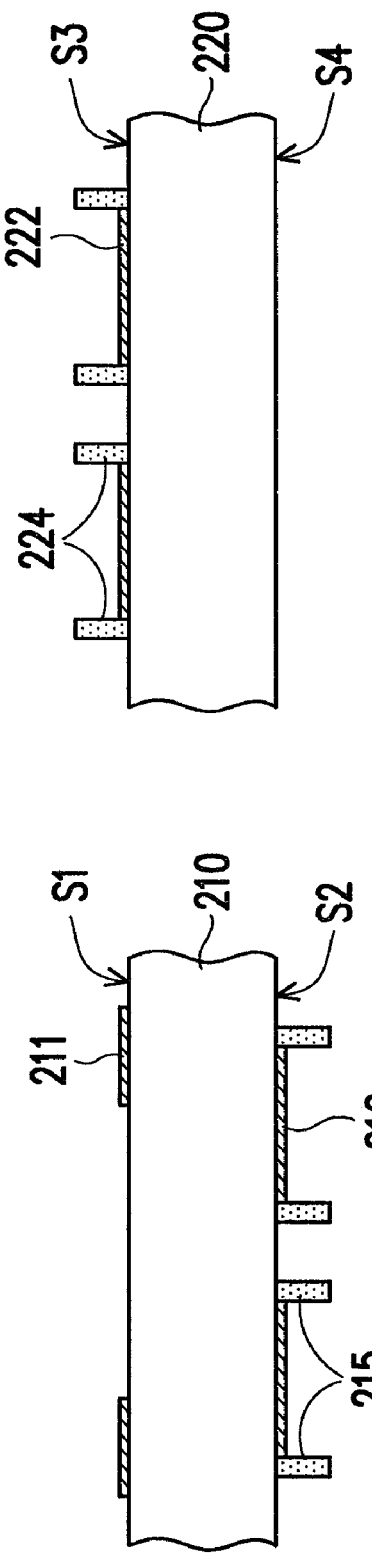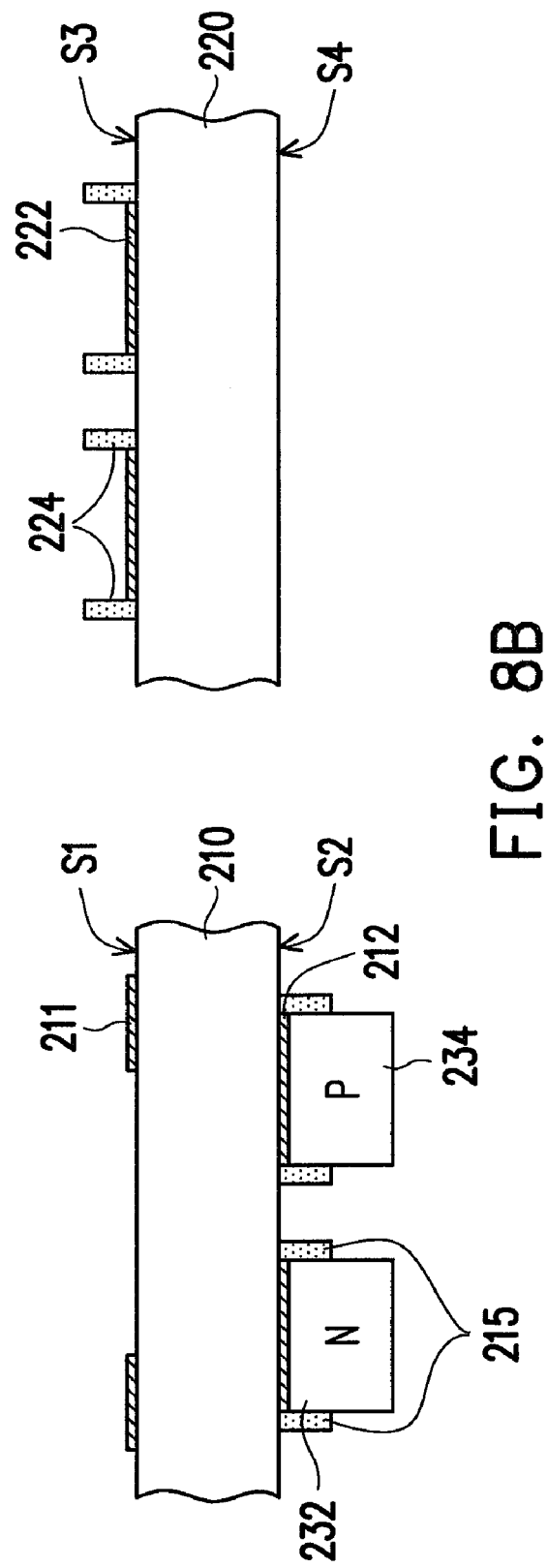
FIG. 8A
FIG. 8B

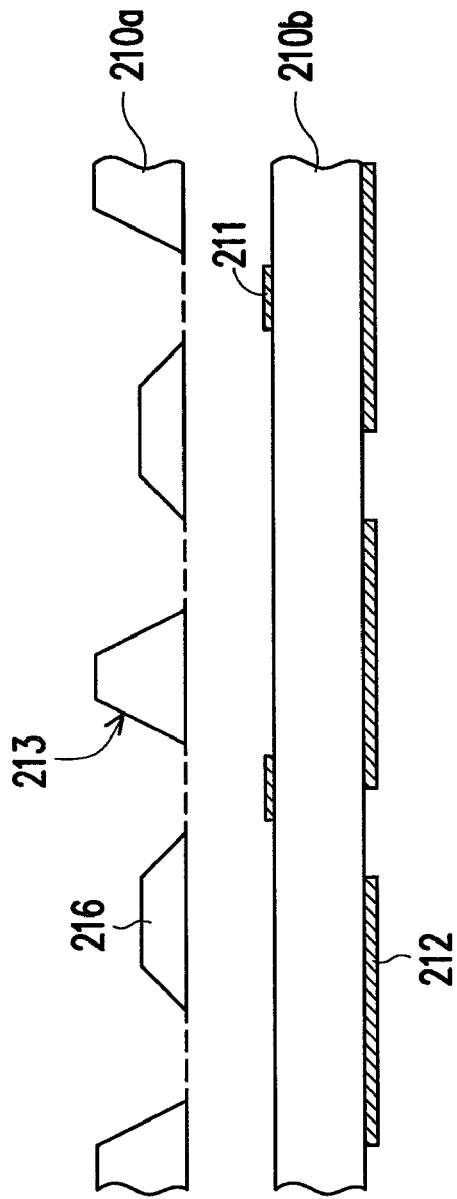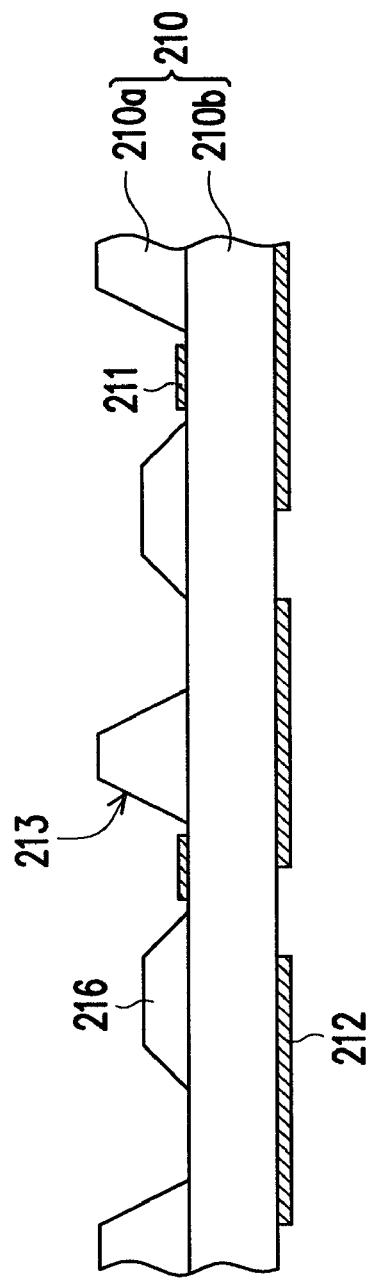

FABRICATING METHOD OF LIGHT EMITTING DIODE PACKAGE

CROSS-REFERENCE TO RELATED APPLICATION

This is a divisional application of patent application Ser. No. 11/309,041, filed on Jun. 13, 2006, which claims the priority benefit of Taiwan application serial no. 95105618, filed on Feb. 20, 2006 and is now pending. The entirety of each of the above-mentioned patent applications is hereby incorporated by reference herein and made a part of this specification.

BACKGROUND OF THE INVENTION

1. Field of Invention

The present invention relates to a fabricating method of a light emitting diode (LED) package structure. More particularly, the present invention relates to a fabricating method of an LED package structure with integration of a thermoelectric cooling device.

2. Description of Related Art

The LED is a semiconductor element, and the material of the light-emitting chip mainly employs one selected from group III-V chemical elements such as GaP, GaAs, GaN, and other compound semiconductors. The light emitting principle is converting electric energy into light, i.e., applying current to the compound semiconductor, such that redundant energy is released in a form of light through the combination of electrons and electron holes, thus achieving the light emitting effect. Since the light emitting phenomenon of the LED is not caused by heating or discharging, the LED is a cold light emitting diode, and thus the service life of the LED may be more than 100,000 hours, and idling time is saved. Further, the LED has the advantages of quick response time (about 10-9 seconds), small volume, energy saving, low pollution (mercury free), high reliability, capable of mass production, etc. Therefore, the LED can be applied in a wide variety of fields, for example, scanner light sources demanding for a fast response, back lights or front lights of liquid crystal displays (LCDs), illumination for instrument panels of vehicles, traffic signal lamps, and ordinary illuminators.

The conventional LED is mainly made of GaN, and the fabricating method thereof is epitaxy. The LED mainly includes a substrate, a semi-conductive layer, and two external electrodes. The semi-conductive layer further includes two confinement layers having N-type and P-type dopants, and a light-emitting layer located between the two confinement layers. When a forward bias voltage is applied to the external electrode, the current flows through the semi-conductive layer, and electrons and electron holes are combined in the light-emitting layer, thus the light-emitting layer emits light.

The LED is a high power element; 80% of the power is output in the form of heat, and the remaining 20% of the power is output in the form of light energy. Therefore, if the LED package structure is not fitted with an appropriate heatsink, the heat generated will result in the rising of temperature inside, thus affecting the light emitting efficiency of the LED and reducing the service life. Therefore, how to dissipate heat from the high power LED is a task to be solved.

In the U.S. Pat. No. 6,902,291, an in-pavement directional LED luminaire is disclosed. In the luminaire structure, a thermoelectric cooler (TE cooler) is arranged below the LED holder. The TE cooler has a cold end and a corresponding hot end. The cold end of the TE cooler is adjacent to the LED holder and the hot end is attached to a heatsink. As such, the heat generated by the LED can be dissipated by the TE cooler and the heatsink. However, an adhesive agent must be used to assemble the LED holder and the TE cooler, and the TE cooler and the heatsink. Therefore, the process of assembly is quite complicated. When the adhesive agent is heated and expands, the bonding between the LED holder and the TE cooler and between the TE cooler and the heatsink is affected. Thus, the desired heatsinking effect cannot be achieved, and the operation of the LED is affected.

SUMMARY OF THE INVENTION

Accordingly, the present invention provides a method of fabricating the LED package structure. The LED module and the thermoelectric cooling device are integratedly fabricated by using a micro-electromechanical process, thus improving the heatsinking ability of the package structure and reducing the complexity in packaging and integration.

The present invention provides a method of fabricating the LED package structure. First, a first circuit substrate and a second circuit substrate are provided. The first circuit substrate has a first surface and a corresponding second surface. The second circuit substrate has a third surface and a corresponding fourth surface. The second surface and the third surface respectively have a plurality of electrodes. Then, a plurality of N-type semiconductor materials and a plurality of P-type semiconductor materials are formed. The N-type semiconductor materials and P-type semiconductor materials are alternatively arranged on the electrodes. Then, the first circuit substrate and the second circuit substrate are assembled. The N-type semiconductor materials and the P-type semiconductor materials are located between the electrodes of the first circuit substrate and the second circuit substrate. The N-type semiconductor materials and the P-type semiconductor materials are electrically connected to the first circuit substrate and the second circuit substrate through the electrodes. Finally, an LED chip is arranged on the first surface of the first circuit substrate, and electrically connected to the first circuit substrate.

In an embodiment of the present invention, the N-type semiconductor materials and the P-type semiconductor materials are respectively formed on the electrodes of the second surface of the first circuit substrate.

In an embodiment of the present invention, the N-type semiconductor materials and the P-type semiconductor materials are respectively formed on the electrodes of the third surface of the second circuit substrate.

In an embodiment of the present invention, a part of the N-type semiconductor materials and a part of the P-type semiconductor materials are respectively formed on the electrodes of the second surface of the first circuit substrate. A part of the N-type semiconductor materials and a part of the P-type semiconductor materials are respectively formed on the electrodes of the third surface of the second circuit substrate.

In an embodiment of the present invention, the second surface of the first circuit substrate further includes a plurality of first positioning portions. The third surface of the second circuit substrate further includes a plurality of second positioning portions corresponding to the first positioning portions. The first positioning portions and second positioning portions are respectively located in the periphery of each electrode.

In an embodiment of the present invention, the N-type semiconductor materials and the P-type semiconductor materials are respectively formed in the first positioning portions of the first circuit substrate and on the electrodes.

In an embodiment of the present invention, the N-type semiconductor materials and the P-type semiconductor materials are respectively formed in the second positioning portions of the second circuit substrate and on the electrodes.

In an embodiment of the present invention, a part of the N-type semiconductor materials and a part of the P-type semiconductor materials are respectively formed in the first positioning portions of the first circuit substrate. A part of the N-type semiconductor materials and a part of the P-type semiconductor materials are respectively formed in the second positioning portions of the second circuit substrate.

In an embodiment of the present invention, when the first circuit substrate and the second circuit substrate are assembled, the first positioning portions are aligned with the second positioning portions, such that the N-type semiconductor materials and the P-type semiconductor materials are electrically connected to the electrodes on the first circuit substrate and the second circuit substrate.

In an embodiment of the present invention, the material of the first positioning portions and the second positioning portions is thick film photoresist.

In an embodiment of the present invention, the first surface and the second surface of the first circuit substrate respectively have an insulation layer, and the electrodes are located on the insulation layer of the second surface.

In an embodiment of the present invention, the first surface of the first circuit substrate has a groove for accommodating the LED chip.

In an embodiment of the present invention, after the first circuit substrate and the second circuit substrate are provided, a reflective film is further formed in the groove.

In an embodiment of the present invention, after the LED chip is electrically connected to the first circuit substrate, the method of fabricating the LED package structure further comprises forming a molding compound on the first surface of the first circuit substrate, wherein the molding compound covers the LED chip.

In an embodiment of the present invention, the third surface of the second circuit substrate has an insulation layer, and the electrodes are located on the insulation layer of the third surface.

In an embodiment of the present invention, after the first circuit substrate and the second circuit substrate are provided, a solder is further formed respectively on the electrodes of the first circuit substrate and the second circuit substrate.

In an embodiment of the present invention, after the first circuit substrate and the second circuit substrate are provided, a plurality of grooves is further formed on the second surface of the first circuit substrate, wherein the electrodes are respectively formed in the grooves.

In an embodiment of the present invention, after the first circuit substrate and the second circuit substrate are provided, a plurality of grooves is further formed on the third surface of the second circuit substrate, wherein the electrodes are respectively formed in the grooves.

In an embodiment of the present invention, after the first circuit substrate and the second circuit substrate are provided, a plurality of grooves is further formed on the second surface of the first circuit substrate and the third surface of the second circuit substrate, wherein the electrodes are respectively formed in the grooves.

In an embodiment of the present invention, the process for making the LED chip electrically connected to the first circuit substrate includes a wire bonding technique or a flip-chip bonding technique.

In an embodiment of the present invention, the method of fabricating the LED package structure further comprises arranging a heatsink on the fourth surface of the second circuit substrate.

In an embodiment of the present invention, the step of providing the first circuit substrate and the second substrate further includes providing a first secondary substrate and a second secondary substrate. The first secondary substrate has a groove and a carrier portion in the groove. A surface of the second secondary substrate has the electrodes. Then, the first secondary substrate and the second secondary substrate are combined by the chip bonding technique, thus forming a first circuit substrate. The carrier portion and the electrodes are respectively located on the two sides of the first circuit substrate.

In an embodiment of the present invention, the first secondary substrate and the second secondary substrate are respectively a silicon substrate.

In an embodiment of the present invention, the groove on the first secondary substrate is formed by etching the silicon substrate.

In an embodiment of the present invention, the groove penetrates a part of the first secondary substrate.

In an embodiment of the present invention, the LED chip is arranged on the carrier portion.

In an embodiment of the present invention, after the LED chip is electrically connected to the first circuit substrate, a molding compound is further formed on the first secondary substrate, and the molding compound covers the LED chip.

In an embodiment of the present invention, the method of fabricating the LED package structure further includes arranging a diffuser plate on the first surface of the first circuit substrate, wherein the diffuser plate is located above the LED chip.

In summary, the LED package structure of the present invention employs a micro-electromechanical process or a semiconductor process to make the thermoelectric cooling device and the LED module directly integrated, thus reducing the distance between the thermoelectric cooling device and the LED chip. As such, the heat dissipation efficiency of the whole LED package structure and the service life of the LED element can be enhanced.

Furthermore, the present invention adopts respectively fabricating the thermoelectric cooling device and the LED module on a silicon substrate, and then integrating the two substrates as a whole to form the LED package structure. Thus, the volume of the whole LED package structure can be reduced, and the process of fabricating the LED package structure can be simplified. Moreover, according to the present invention, the positioning portions can be respectively fabricated on the corresponding surfaces of the two substrates, so as to enhance the reliability for assembling the two substrates by the alignment of the positioning portions.

BRIEF DESCRIPTION OF THE DRAWINGS

FIGS. 8A-8E are cross-sectional views of the process of fabricating an LED package structure according to another preferred embodiment of the present invention.

FIGS. 10A-10E are cross-sectional views of the process of fabricating an LED package structure according to another preferred embodiment of the present invention.

DESCRIPTION OF EMBODIMENTS

Figure 1:
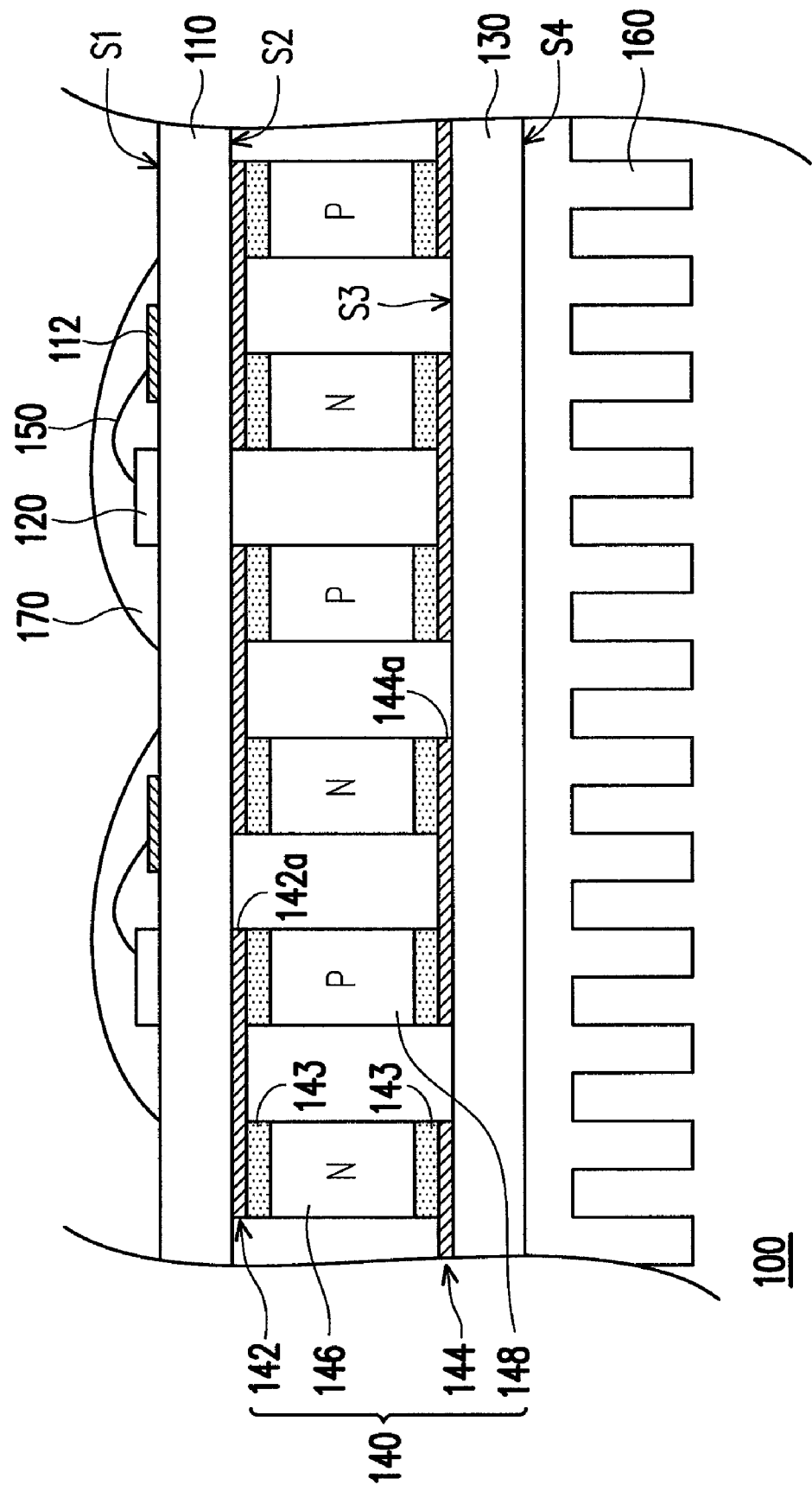
FIG. 1 is a schematic cross-sectional view of an LED package structure according to a preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of an LED package structure according to a preferred embodiment of the present invention. Referring to FIG. 1, the LED package structure 100 of the present invention mainly includes a first substrate 110, a plurality of LED chips 120, a second substrate 130, and a thermoelectric cooling device 140. In the embodiment, two LED chips 120 are arranged on the first substrate 110, which is taken as an example for illustration. However, based on different requirements for specific uses, one or more LED chips 120 can be arranged on the first substrate 110. The number of the LED chips 120 is not limited in the present invention.

Figure 2:
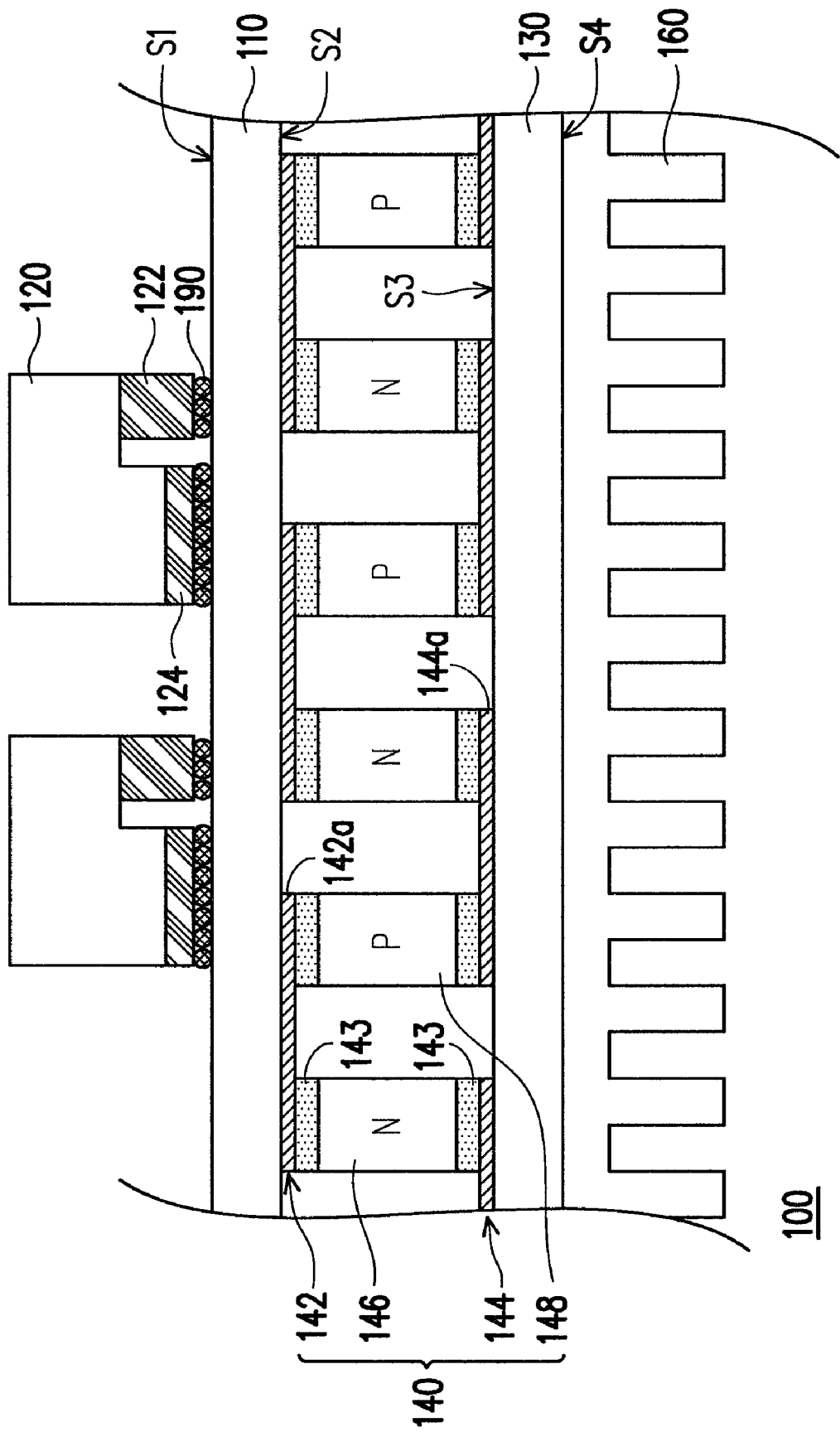
FIG. 2 is a schematic cross-sectional view of an LED chip electrically connected to the substrate by using the flip-chip bonding technique according to the present invention.

The first substrate 110 has a first surface S1 and a corresponding second surface S2. In this embodiment, the first substrate 110 is a silicon substrate, and the circuit or other elements used to drive the LED chip 120 is fabricated on the silicon substrate by a micro-electromechanical process, thus achieving the purpose of integrating the process and reducing the volume of the package structure. The LED chip 120 is arranged on the first surface S1 of the first substrate 110 to emit a light. The LED chip 120 is electrically connected to the first substrate 110. In the embodiment, the LED chip 120 is electrically connected to the electrode 112 formed on the first substrate 110 by a bonding wire 150. In addition to using the wire bonding technique to electrically connect the LED chip 120 to the first substrate 110, referring to FIG. 2, the N-type contact pad 122 and the P-type contacting pad 124 of the LED chip 120 are electrically connected to the first substrate 110 by a plurality of solder balls 190 through a flip-chip bonding technique or other manners in the present invention. The way of electrically connecting the LED chip 120 to the first substrate 110 is not limited in the present invention. Further, a molding compound 170 can be selectively arranged on the first surface S1 of the first substrate 110. The molding compound 170 covers the LED chip 120, the electrode 112, and the bonding wire 150, thus protecting the elements from being damaged and affected with damp. The material of the molding compound 170 is epoxy resin or silicone.

The second substrate 130 is located below the first substrate 110, and the second substrate 130 has a third surface S3 and a corresponding fourth surface S4. The third surface S3 faces the second surface S2 of the first substrate 110. Likewise, the second substrate 130 is a silicon substrate or a substrate composed of other materials.

The thermoelectric cooling device 140 is arranged between the second surface S2 of the first substrate 110 and the third surface S3 of the second substrate 130. When current is conducted to the thermoelectric cooling device 140, one end of the thermoelectric cooling device 140 functions as a cold end, and the other end functions as a hot end. In the present invention, the cold end of the thermoelectric cooling device 140 is attached to the second surface S2 of the first substrate 110 carrying the LED chip 120, and the hot end is attached to the third surface S3 of the second substrate 130, such that the heat generated by the LED chip 120 during operation is conducted to the second substrate 130 by the thermoelectric cooling device 140. As such, the heat generated by the LED chip 120 during operation is dissipated, thus avoiding unnecessary heat accumulation and improving the performance of the LED chip 120.

Further, the thermoelectric cooling device 140 includes a first patterned electrode layer 142, a second patterned electrode layer 144, a plurality of N-type semiconductor materials 146, and a plurality of P-type semiconductor materials 148. The first patterned electrode layer 142 includes a plurality of first electrodes 142a arranged on the second surface S2 of the first substrate 110. Likewise, the second patterned electrode layer 144 includes a plurality of second electrodes 144a located on the third surface S3 of the second substrate 130. In the embodiment, the first electrodes 142a and second electrodes 144a are respectively formed on the first substrate 110 and the second substrate 130 by electroplating or other manners. The material of the first electrodes 142a and the second electrodes 144a is Au/Ti or Cu/Ti. A plurality of N-type semiconductor materials 146 and a plurality of P-type semiconductor materials 148 are alternatively arranged between the first electrodes 142a and the second electrodes 144a, and are electrically connected to the first electrodes 142a and the second electrodes 144a, so as to form a current loop, for example, a series loop or a parallel loop. Thus, by controlling the direction of the current flow applied to the thermoelectric cooling device 140, the upper end of the thermoelectric cooling device 140 functions as a cold end, and the lower end functions as a hot end, thus conducting heat. Common thermoelectric materials are semiconductor materials with N-type and P-type characteristics, for example, $Bi_2Te_3$, $Bi_2SbTe_3$, SiGe alloy, and the like. Further, a heatsink 160 is selectively arranged on the fourth surface S4 of the second substrate 130, so as to accelerate the conducting of heat. In an embodiment of the present invention, first, a plurality of solders 143 is formed on a partial area of the first electrodes 142a and the second electrodes 144a, such that the N-type semiconductor materials 146 and the P-type semiconductor materials 148 are electrically connected to the first electrodes 142a and the second electrodes 144a by the solders 143.

Figure 3:
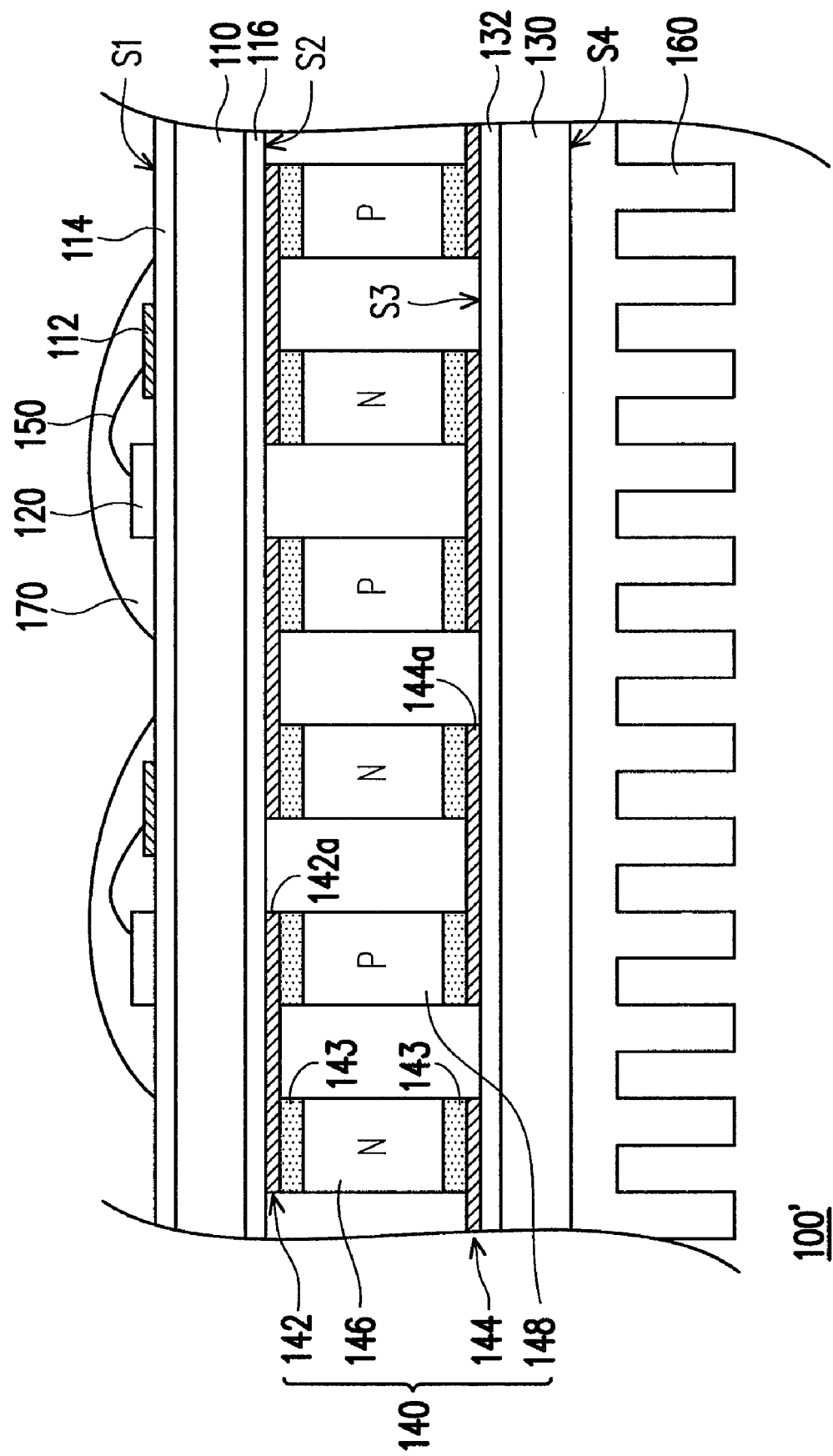
FIG. 3 is a schematic cross-sectional view of an LED package structure according to another preferred embodiment of the present invention.

FIG. 3 is a schematic cross-sectional view of an LED package structure according to another preferred embodiment of the present invention. Referring to FIG. 3, the LED package structure 100' is substantially same as the LED package structure 100 as shown in FIG. 1. However, in the embodiment, a first insulation layer 114 and a second insulation layer 116 are respectively formed on the first surface S1 and the second surface S2 of the first substrate 110. A third insulation layer 132 is formed on the third surface S3 of the second substrate 130. The elements formerly formed on the first substrate 110 and the second substrate 130 directly are formed on the first insulation layer 114, the second insulation layer 116, and the third insulation layer 132. As such, a current leakage between the elements can be avoided by disposing the insulation layers. Of course, based on different requirements for specific uses, the insulation layer may be selectively formed on any one or two surfaces of the first surface S1, the second surface S2, and the third surface S3. The arrangement of the first insulation layer 114, the second insulation layer 116, and the third insulation layer 132 is not limited in the present invention.

Figure 4:
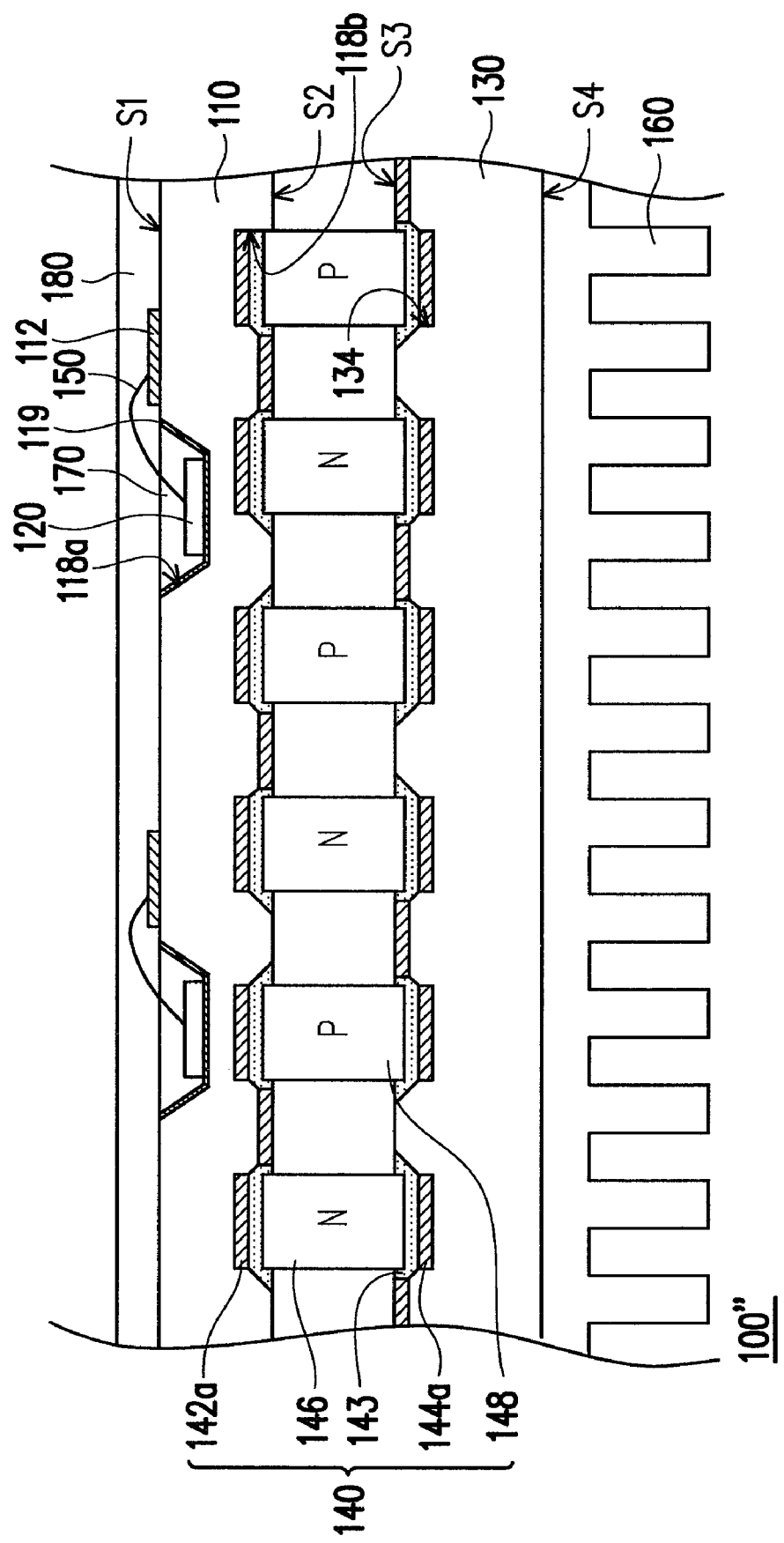
FIG. 4 is a schematic cross-sectional view of an LED package structure according to another preferred embodiment of the present invention.

FIG. 4 is a schematic cross-sectional view of an LED package structure according to another preferred embodiment of the present invention. Referring to FIG. 4, the LED package structure 100" is substantially same as the LED package structure 100 as shown in FIG. 1. However in this embodiment, a groove 118a is formed on the first surface S1 of the first substrate 110, and the LED chip 120 mentioned above is arranged in the groove 118a. As such, the light emitted by the LED chip 120 is reflected by the sidewall and the bottom of the groove 118a, thus achieving a good light-converging effect and increasing the light emitting efficiency. Further, a reflective film 119 is selectively formed on the sidewall and the bottom of the groove 118a, thus increasing the chance for reflecting light.

Referring to FIG. 4, in the present invention, a diffuser plate 180 is arranged on the first surface S1 of the first substrate 110. The diffuser plate 180 is located above the LED chip 120. Thus, the light emitted by the LED chip 120 is diffused by the diffuser plate 180, and the emitted light is more uniform. The diffuser plate 180 is one selected from among a lens, a plate made of PMMA, or other element suitable for diffusing light.

Figure 5:
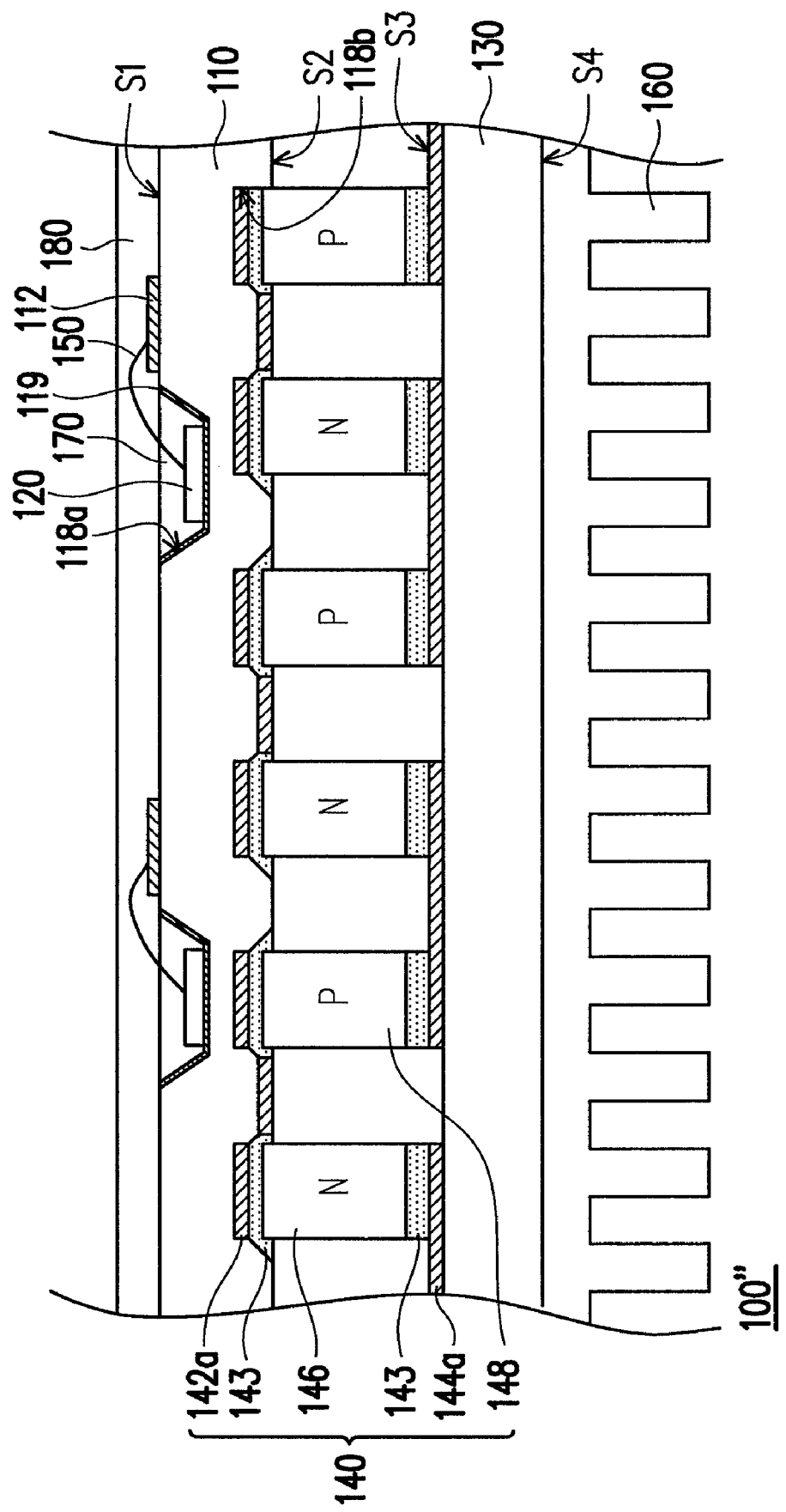
FIG. 5 is a schematic cross-sectional view of an LED package structure according to another preferred embodiment of the present invention.

Further, in the LED package structure 100" as shown in FIG. 4, a plurality of grooves 118b is formed on the second surface S2 of the first substrate 110, and the electrodes 142a are located in the grooves 118b. A plurality of grooves 134 is formed on the third surface S3 of the second substrate 130. Likewise, the electrodes 144a are located in the grooves 134. As such, two ends of each N-type semiconductor material 146 and P-type semiconductor material 148 are embedded in the first substrate 110 and the second substrate 130, so as to reduce the distance between the thermoelectric cooling device 140 and the LED chip 120 and the distance between the thermoelectric cooling device 140 and the heatsink 160, such that the heat generated by the LED chip 120 during operation can be dissipated more quickly. Referring to FIG. 5, based on different requirements for specific uses, one end of each N-type semiconductor material 146 and one end of each P-type semiconductor material 148 are embedded in the first substrate 110. Further, one end of each N-type semiconductor material 146 and one end of each P-type semiconductor material 148 can be embedded in the second substrate 130, which is not limited in the present invention.

The method of fabricating the LED package structure of the present invention will be illustrated with reference to the drawings. The fabricating of the LED package structure of the present invention employs a micro-electromechanical process or a semiconductor package process to fabricate the LED module and the thermoelectric cooling device on the silicon substrate. Since silicon has a good heat conducting ability, it helps to dissipate heat from the LED chip, and the process of fabricating the LED package structure can be simplified.

FIGS. 6A-6D are cross-sectional views of the process of fabricating an LED package structure according to a preferred embodiment of the present invention. First, referring to FIG. 6A, a first circuit substrate 210 and a second circuit substrate 220 are provided. The first circuit substrate 210 has a first surface S1 and a corresponding second surface S2. A plurality of electrodes 211, 212 are disposed on the first surface S1 and the second surface S2 of the first substrate 210. The first surface S1 of the first circuit substrate 210 is used to carry the LED chip, and the electrode 211 located above the surface is electrically connected to the LED chip. The second circuit substrate 220 has a third surface S3 and a corresponding fourth surface S4. The third surface S3 has a plurality of electrodes 222 corresponding to the electrodes 212.

Likewise, an insulation layer (not shown) is selectively formed on the first surface S1, the second surface S2 of the first circuit substrate 210 and the third surface S3 of the second circuit substrate 220. Then, the electrodes 211, 212, 222 are formed on the insulation layer, so as to avoid current leakage between the elements.

Figure 6A:
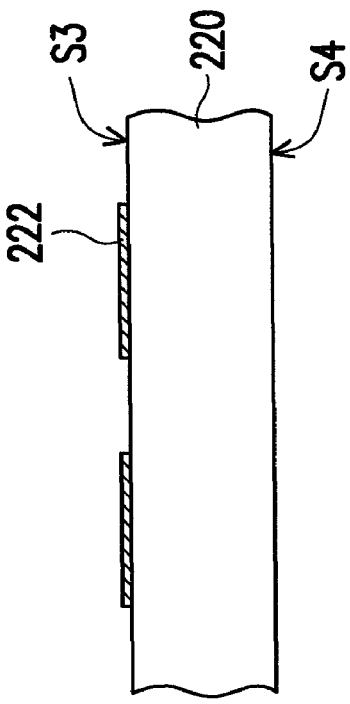
FIGS. 6A-6D are cross-sectional views of the process of fabricating an LED package structure according to a preferred embodiment of the present invention.
Figure 6B:
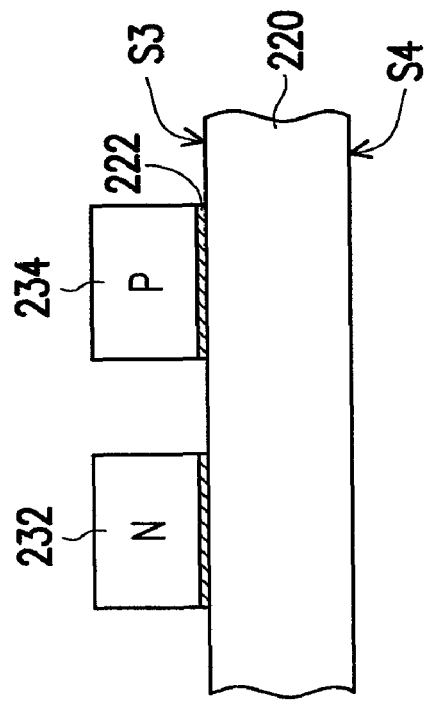

Then, referring to FIG. 6B, a plurality of N-type semiconductor materials 232 and a plurality of P-type semiconductor materials 234 are formed (In FIG. 6B, a group of N-type semiconductor material 232 and P-type semiconductor material 234 is shown for illustration). In the embodiment, the N-type semiconductor materials 232 and P-type semiconductor materials 234 are alternatively formed on the electrodes 222 of the second circuit substrate 220. However, the N-type semiconductor materials 232 and P-type semiconductor materials 234 can also be alternatively formed on the electrodes 212 of the first circuit substrate 210. Alternatively, a part of the N-type semiconductor materials 232 and P-type semiconductor materials 234 can be formed on the electrodes 212 of the first circuit substrate 210, and the remaining N-type semiconductor materials 232 and P-type semiconductor materials 234 are formed on the electrodes 222 of the second circuit substrate 220.

Further, before the N-type semiconductor materials 232 and P-type semiconductor materials 234 are formed on the electrodes 222, a solder (not shown) is formed on the electrodes 222, such that the N-type semiconductor materials 232 and P-type semiconductor materials 234 are easily electrically connected to the electrodes 222.

Figure 6D:
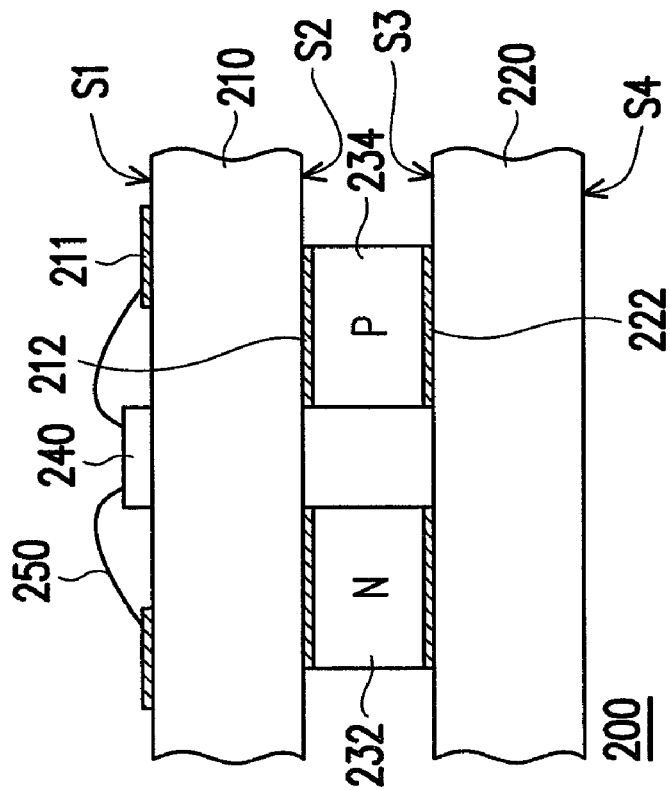
Figure 6C:
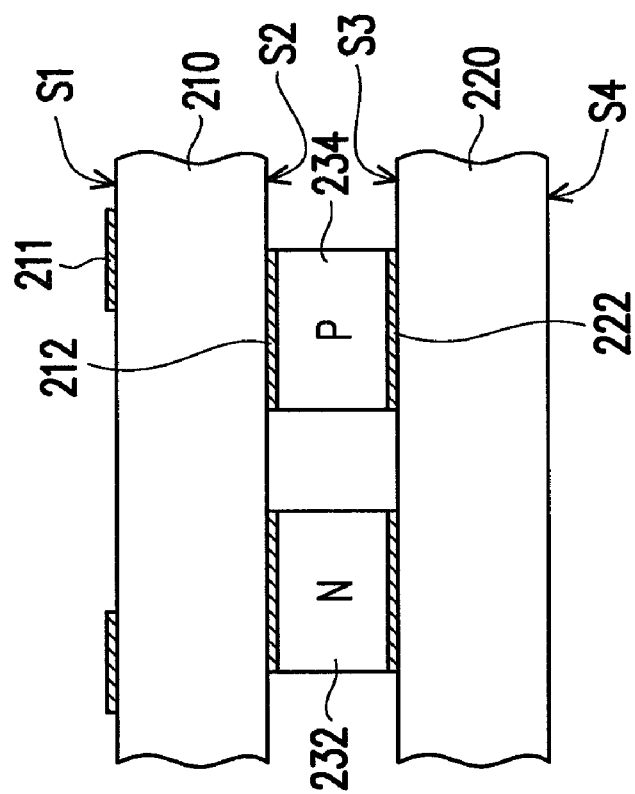

Then, referring to FIG. 6C, the first circuit substrate 210 and the second circuit substrate 220 are assembled. The N-type semiconductor materials 232 and the P-type semiconductor materials 234 are located between the electrodes 212 of the first circuit substrate 210 and the electrodes 222 of the second circuit substrate 220. The N-type semiconductor materials 232 and the P-type semiconductor materials 234 are electrically connected to the first circuit substrate 210 and the second circuit substrate 220 by the electrodes 212, 222.

Finally, referring to FIG. 6D, an LED chip 240 is arranged on the first surface S1 of the first circuit substrate 210, and a bonding wire 250 is formed by a wire bonding technique, such that the LED chip 240 is electrically connected to the first circuit substrate 210 by the bonding wire 250. Thus, the basic process of fabricating the LED package structure 200 is finished. However, in the steps as shown in FIG. 6, the LED chip 240 can be electrically connected to the first circuit substrate 210 by the flip-chip bonding technique or other manners, which is not limited in the present invention.

Groove, Reflective Film, and Molding Compound

Figure 7A:
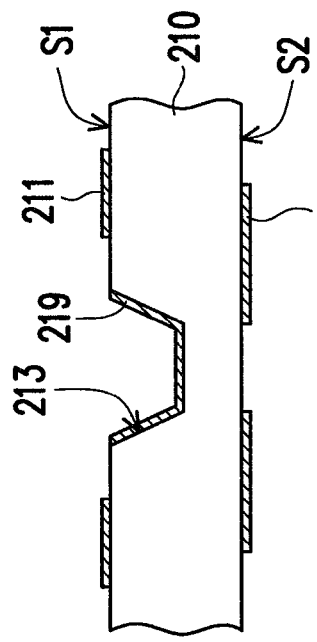
FIGS. 7A-7C are cross-sectional views of a part of the process of fabricating an LED package structure according to another preferred embodiment of the present invention.
Figure 7B:
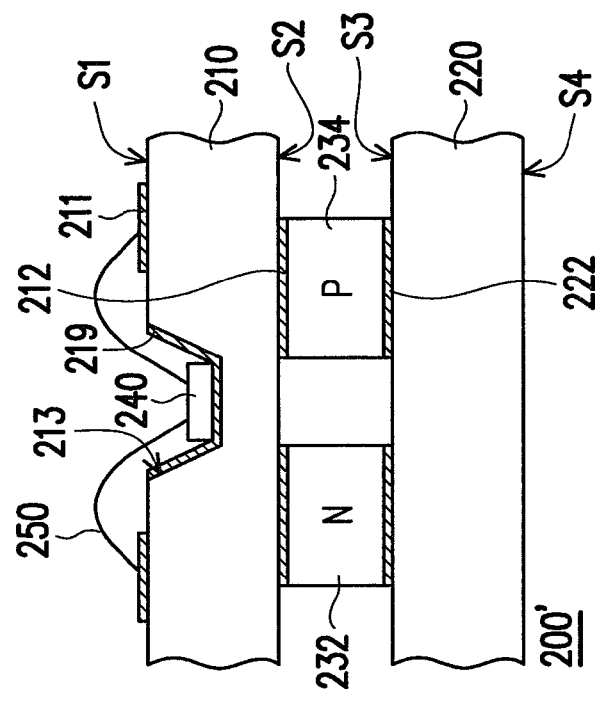

In order to effectively improve the light emitting efficiency of the LED chip 240, referring to FIG. 7A, when the first circuit substrate 210 is provided, a groove 216 is formed on the first surface S1 of the first circuit substrate 210. The groove 216 is used to accommodate the LED chip 240. Further, a reflective film 219 is selectively formed on the sidewall and the bottom of the groove 216. As such, after finishing the fabrication of the whole LED package structure 200' by using the fabricating process as shown in FIGS. 6A-6D, referring to FIG. 7B, the light emitted by the LED chip 240 produces preferable light emitting effect by reflecting with the reflective film 217. Further, in order to prevent the LED chip 240 and the bonding wire 250 from being damaged and affected with damp, referring to FIG. 7C, a molding compound 270 is formed on the first surface S1 of the first circuit substrate 210. The molding compound 270 covers the LED chip 240 and the bonding wire 250, so as to prevent the LED chip 240 and the bonding wire 250 in the LED package structure 200' from being affected with damp outside and contaminated by dust. The material of the molding compound 270 is epoxy resin or silicone.

Positioning Portion and Assembly Process Thereof

In order to make the assembly and alignment of the first circuit substrate 210 and the second circuit substrate 220 more exact, and increase the reliability of the assembling of the thermoelectric cooling device, when the first circuit substrate 210 and the second circuit substrate 220 are provided, as shown in FIG. 8A, first, a plurality of first positioning portions 215 are formed on the second surface S2 of the first circuit substrate 210. Each of the first positioning portions 215 is respectively located in the periphery of one electrode 212. Likewise, a plurality of second positioning portions 224 is formed on the third surface S3 of the second circuit substrate 220. Each of the second positioning portions 224 is respectively located in the periphery of one of the electrodes 222, and the position of each first positioning portion 215 corresponds to the position of each second positioning portion 224. Furthermore, the manner of forming the first positioning portion 215 and the second positioning portion 224 includes first spin-coating a thick film photoresist on the surface of the circuit substrate, e.g. SU-8. Then, the desired positioning portion can be formed in the periphery by using a lithography technique.

Then, referring to FIG. 8B, a plurality of N-type semiconductor materials 232 and a plurality of P-type semiconductor materials 234 are formed. In the embodiment, the N-type semiconductor materials 232 and P-type semiconductor materials 234 are alternatively formed on the electrodes 212 of the first circuit substrate 210. However, the N-type semiconductor materials 232 and P-type semiconductor materials 234 may also be formed alternatively on the electrodes 222 of the second circuit substrate 220. Alternatively, a part of the N-type semiconductor materials 232 and P-type semiconductor materials 234 are formed on the electrodes 212 of the first circuit substrate 210, and the remaining N-type semiconductor materials 232 and P-type semiconductor materials 234 are formed on the electrodes 222 of the second circuit substrate 220.

Figure 8D:
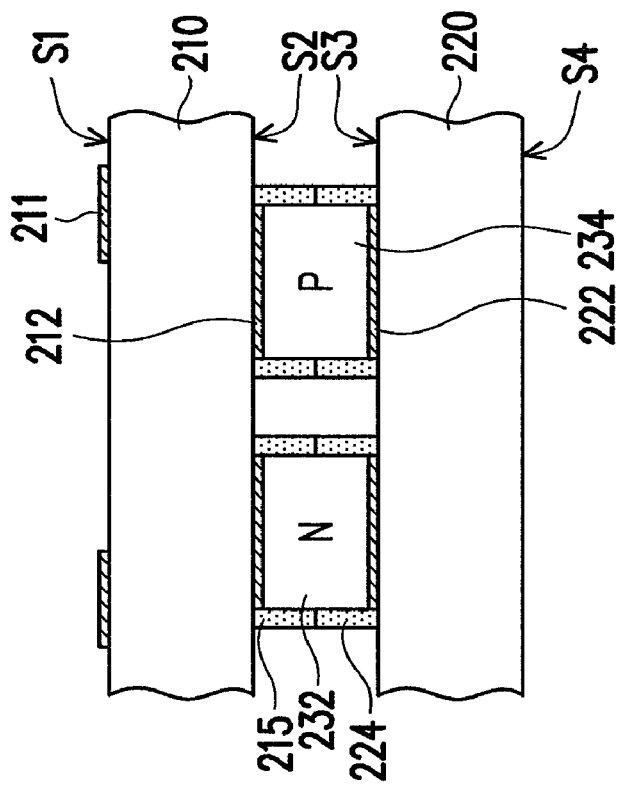
Figure 8C:
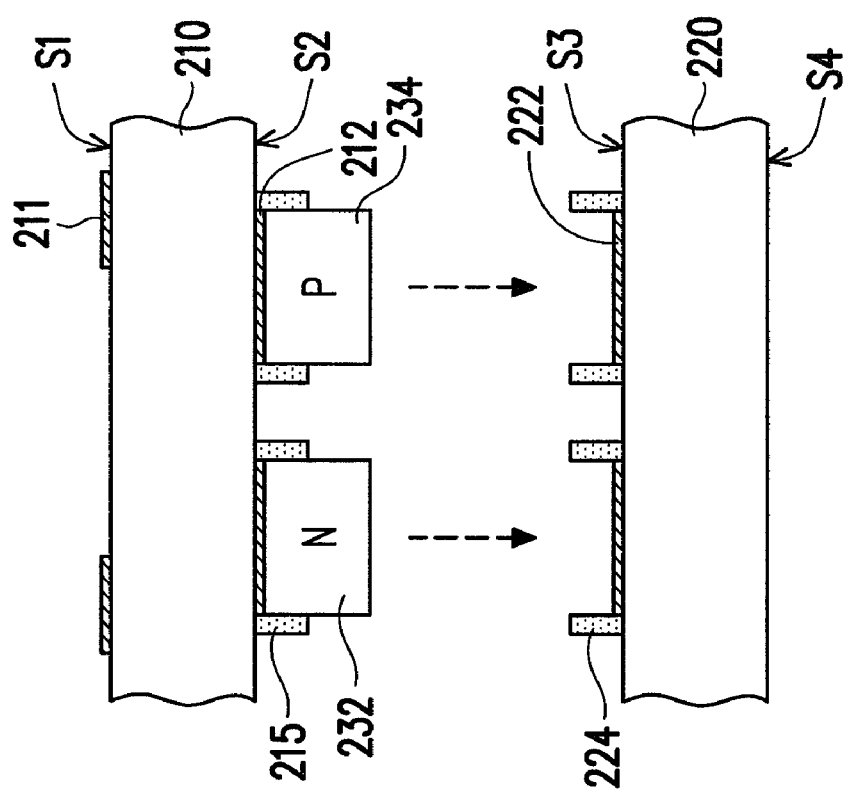

Then, referring to FIG. 8C, the first positioning portions 215 of the first circuit substrate 210 are aligned with the second positioning portions 224 of the second circuit substrate 220, and the two are combined together. Thus, the lower ends of each N-type semiconductor material 232 and each P-type semiconductor material 234 are located in the corresponding second positioning portions 224, and one end of the N-type semiconductor material 232 and one end of the P-type semiconductor material 234 are electrically connected to the electrodes 222, thus forming the structure as shown in FIG. 8D. Finally, referring to FIG. 8E, the LED chip 240 is arranged on the first surface S1 of the first circuit substrate 210, and electrically connected to the first circuit substrate 210, thus the fabrication of the LED package structure is finished.

Heatsink

Figure 7C:
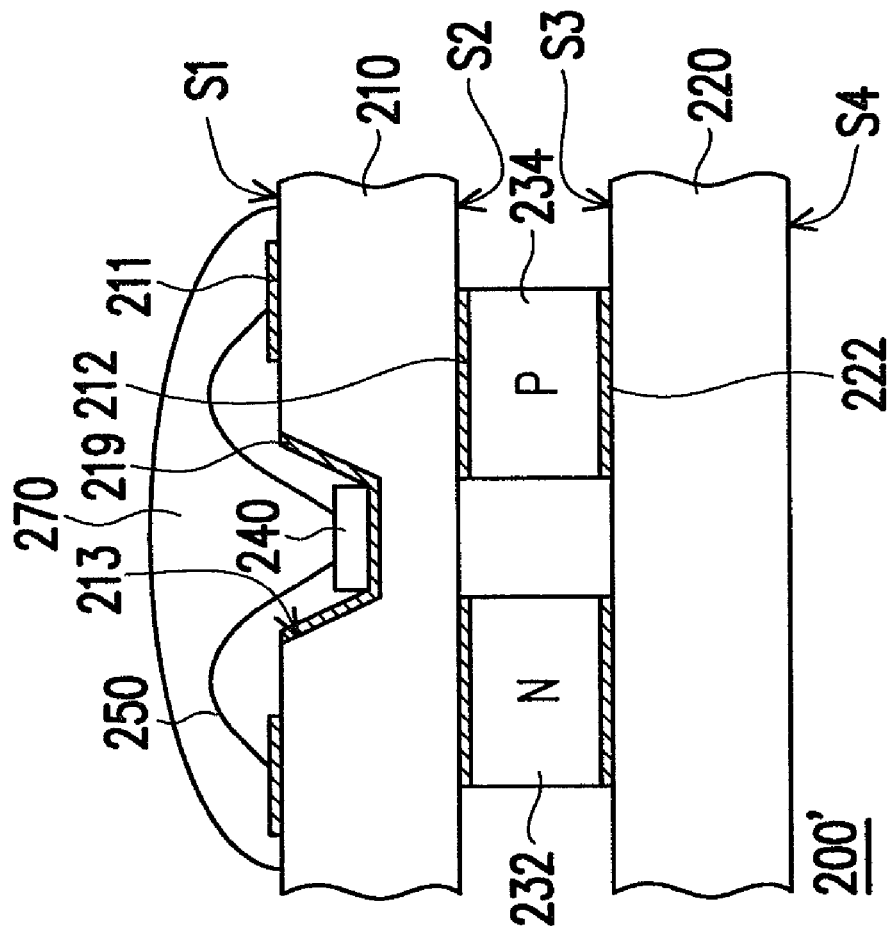
Figure 8E:
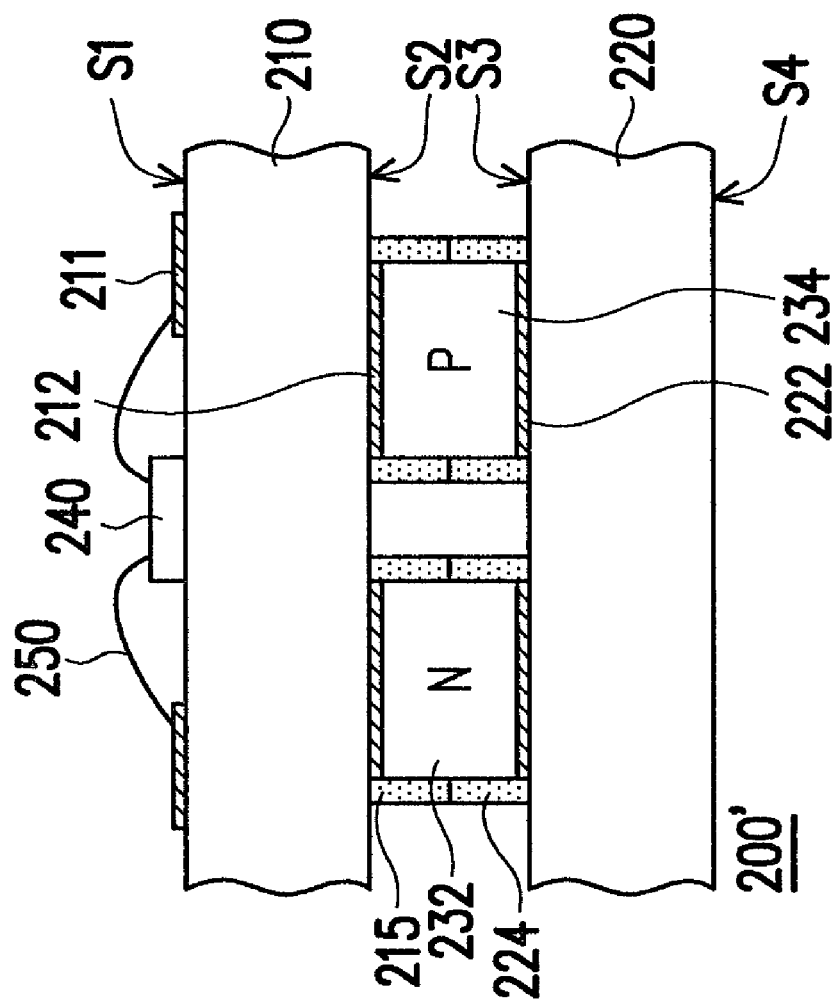

In order to increase the heatsinking efficiency of the LED package structures 200, 200', and 200'' as shown in FIG. 6D, FIG. 7C, and FIG. 8E, after finishing the fabrication of the LED package structures 200, 200', and 200'', a heatsink is arranged on the fourth surface S4 of the second circuit substrate 220, such that the heat accumulated on the second circuit substrate can be conducted by the heatsink.

Groove

Figure 9A:
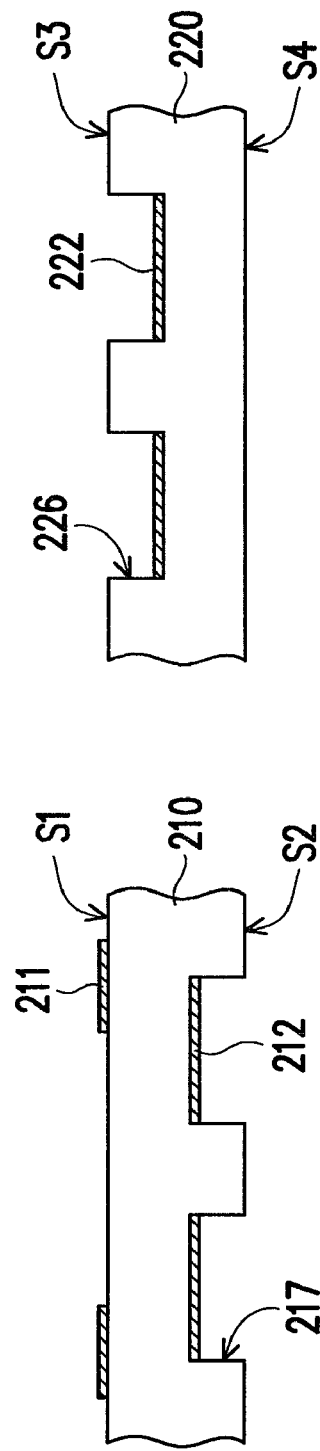
FIGS. 9A-9B are cross-sectional views of a part of the process of fabricating an LED package structure according to another preferred embodiment of the present invention.
Figure 9B:
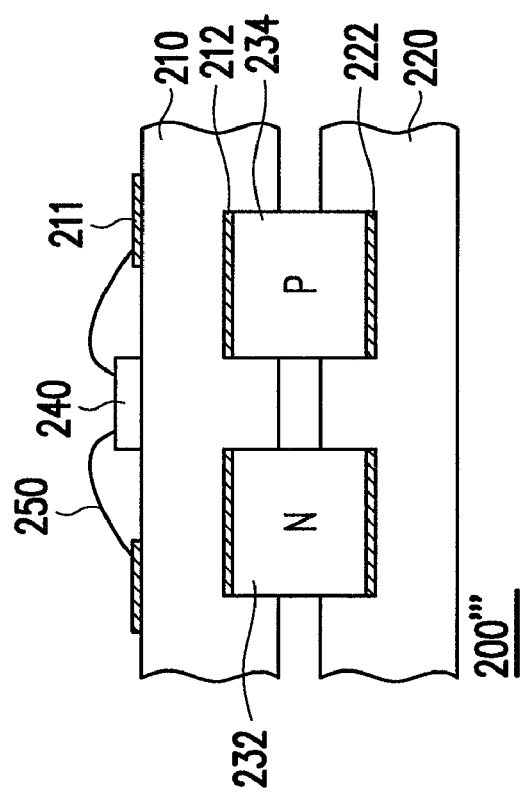

In order to increase the heatsinking efficiency of the whole LED package structure, and to make the assembly and alignment of the first circuit substrate 210 and the second circuit substrate 220 more exact, when the first circuit substrate 210 and the second circuit substrate 220 are provided, referring to FIG. 9A, first a plurality of grooves 217 is formed on the second surface S2 of the first circuit substrate 210, and an electrode 212 is formed in each groove 217. Likewise, a plurality of grooves 226 is formed on the third surface S3 of the second circuit substrate 220, and an electrode 222 is formed in each groove 226. Likewise, the LED package structure 200''' as shown in FIG. 9B is formed according to the steps as shown in FIGS. 6B-6D. As the thermoelectric cooling device of the LED package structure 200''' is much closer to the LED chip 240, the heat conduction is accelerated, facilitating the heatsinking of the LED chip 240. Further, because the N-type semiconductor materials 232 and the P-type semiconductor materials 234 are formed in the grooves 217 of the first circuit substrate 210 or in the grooves 226 of the second circuit substrate 220, when the first circuit substrate 210 and the second circuit substrate 220 are assembled, another end of the N-type semiconductor materials 232 and another end of the P-type semiconductor materials 234 are located in the corresponding grooves 217 or grooves 226. Thus, the precision of the assembly and alignment of the first circuit substrate 210 and the second circuit substrate 220 are effectively enhanced.

Further, in order to increase the light emitting intensity of the LED chip 240, in the present invention, the groove structure used to carry the LED chip 240 and the electrodes of the thermoelectric cooling device are respectively formed on the two silicon substrates. Then, the two silicon substrates are bonded by using the chip bonding technique, thus forming a circuit substrate similar to the first circuit substrate 210 as shown in FIG. 7A.

FIGS. 10A-10E are flow charts of the method of fabricating a first circuit substrate shown in FIG. 7A. First, referring to FIG. 10A, a first secondary substrate 210a and a second secondary substrate 210b are provided. The first secondary substrate 210a has a groove 213 and a carrier portion 216 in the groove 213. The island-shaped carrier portion 216 is used to carry the LED chip 240. The two opposite surfaces of the second secondary substrate 210b respectively have the electrodes 211, 212.

In one embodiment of the present invention, the first secondary substrate 210a and the second secondary substrate 210b are silicon substrates. The groove 213 on the first secondary substrate 210a is formed by etching through a part of the silicon substrate.

Figure 10C:
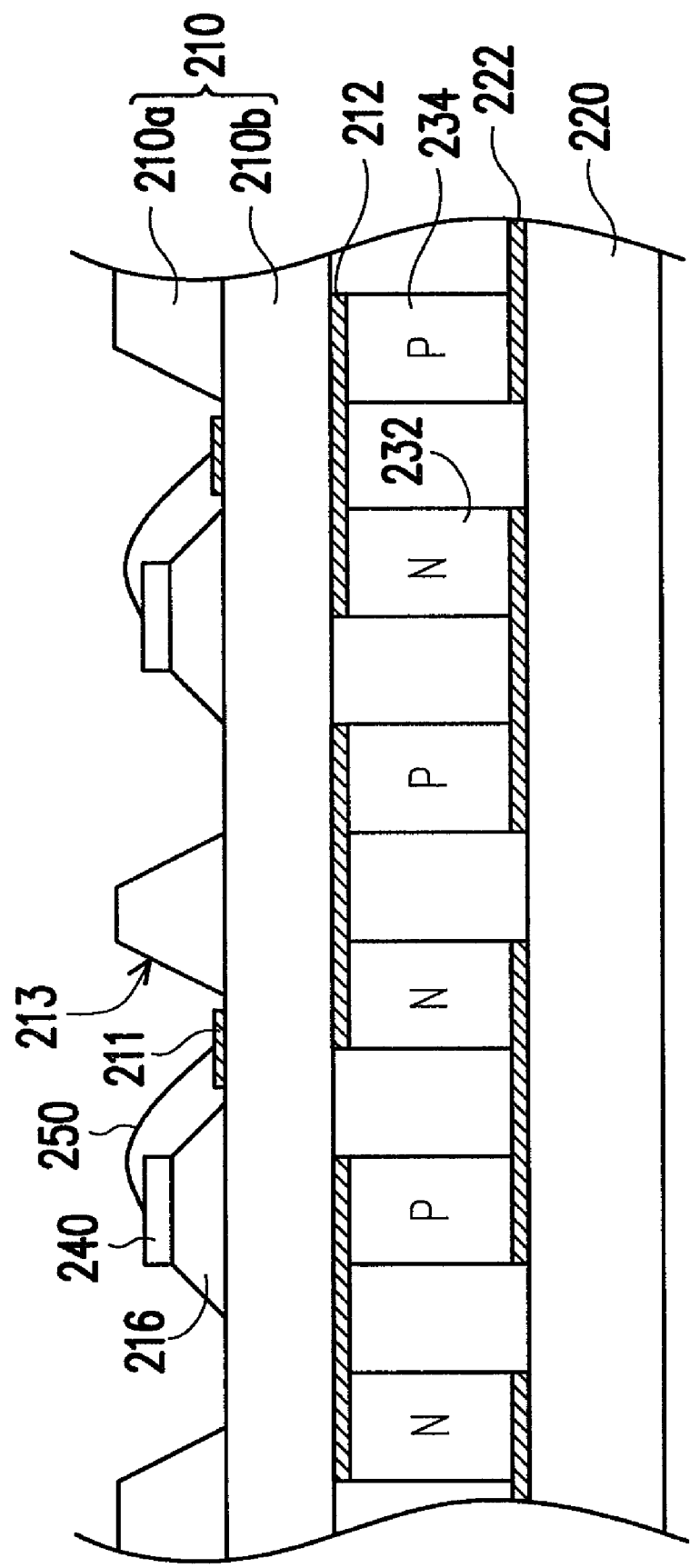
Figure 10D:
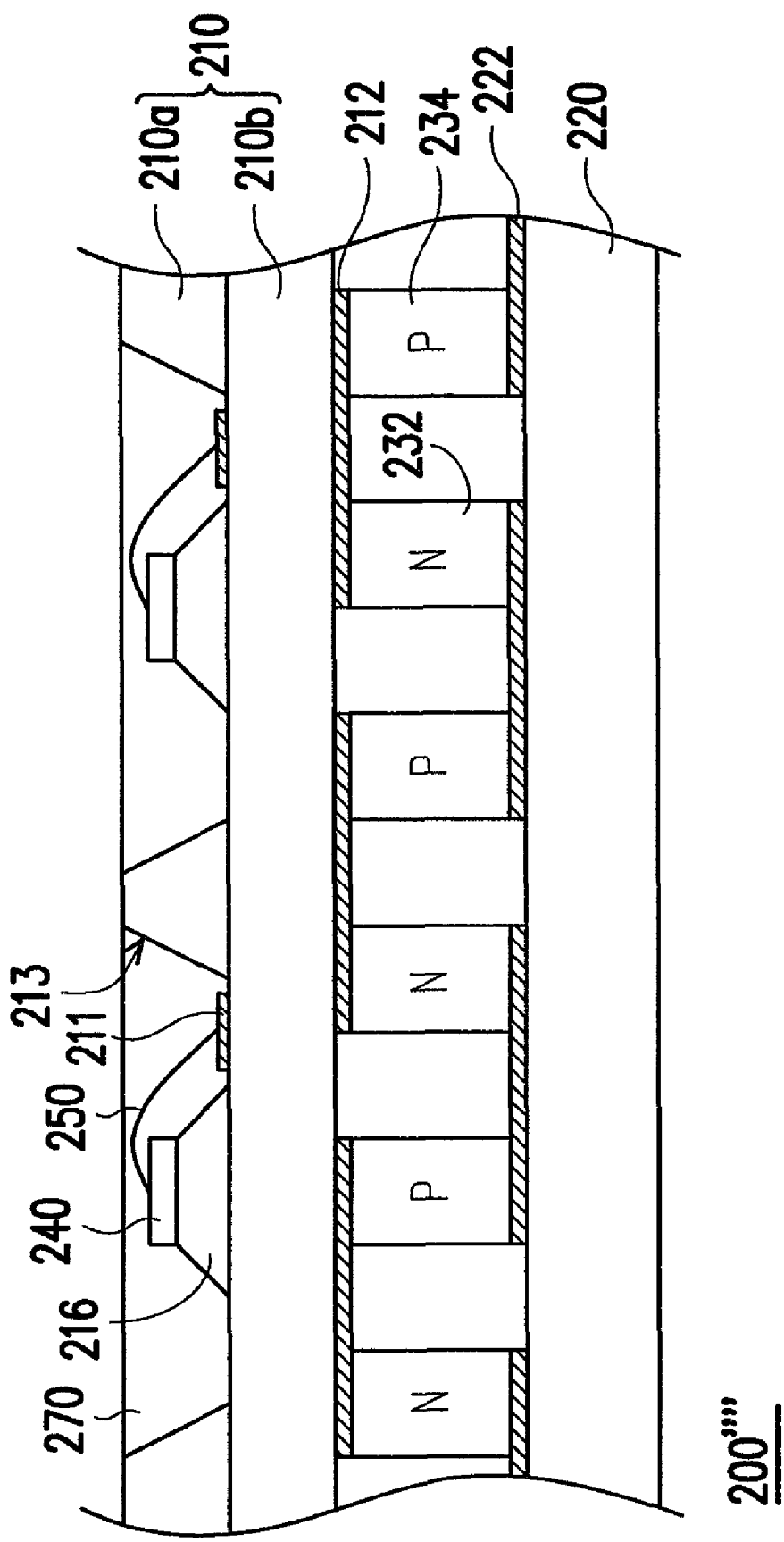
Figure 10E:
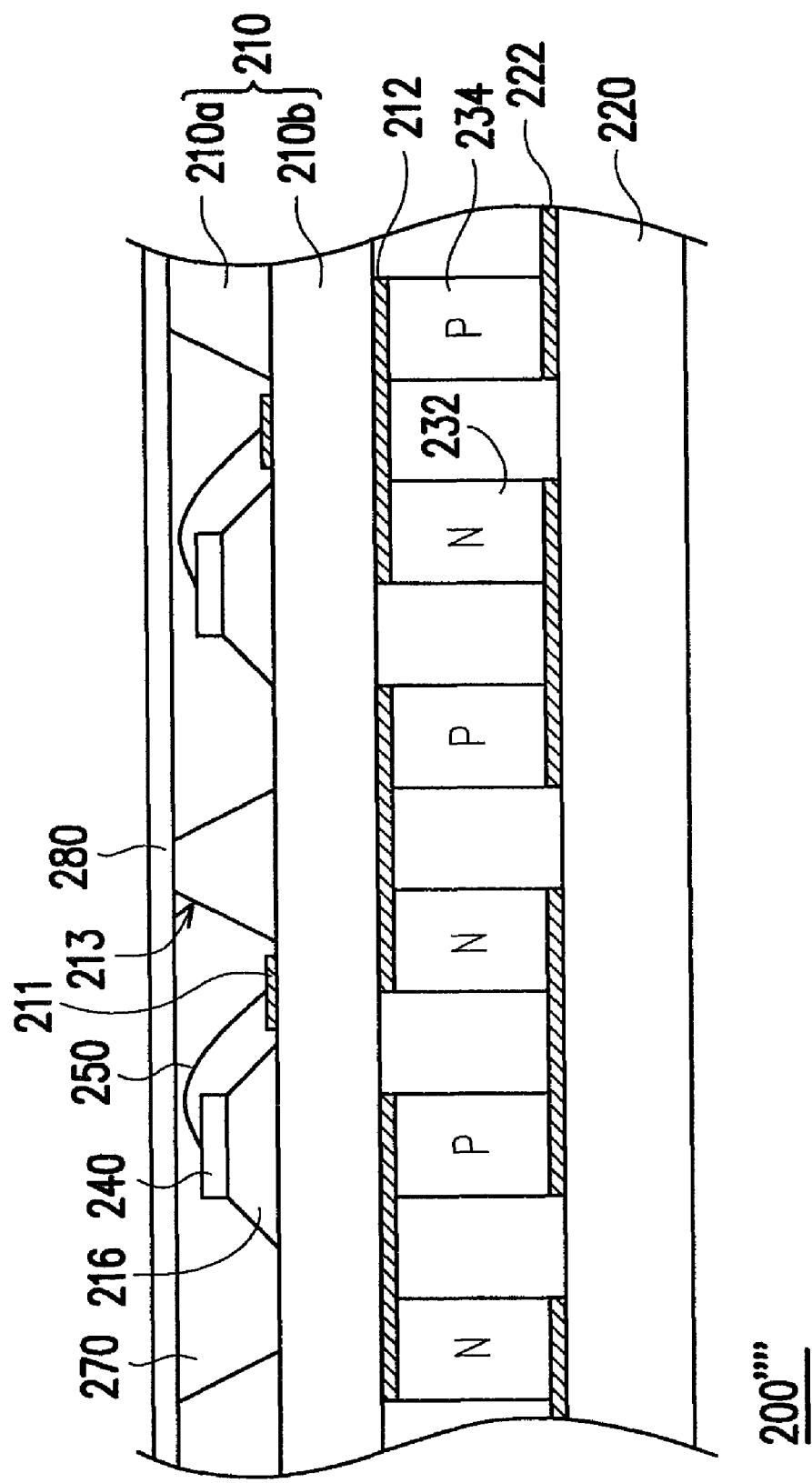

Then, referring to FIG. 10B, the first secondary substrate 210a and the second secondary substrate 210b are combined by the chip bonding technique, so as to form a first circuit substrate 210. The carrier portion 216 and the electrode 212 are respectively located on the two sides of the first circuit substrate 210. Likewise, the steps as shown in FIG. 6B to FIG. 6D are performed, so as to form the LED package structure 200'''' as shown in FIG. 10C. Further, in order to prevent the LED package structure 200'''' from being affected with damp or damaged, referring to FIG. 10D, a molding compound 270 is formed on the first secondary substrate 210a and covers the LED chip 240 and the bonding wire 250, thus preventing the LED chip 240 and the bonding wire 250 in the LED package structure 200' from being affected with damp outside or contaminated by dust. Also, in order to make the light emitted by the LED chip 240 more uniform, referring to FIG. 10E, a diffuser plate 280 is arranged on the first secondary substrate 210a. This diffuser plate 280 is located above the LED chip 240, and is one selected from among a lens, a plate made of PMMA, and other elements suitable for diffusing light, so as to enhance the diffusion of light.

To sum up, the LED package structure of the present invention employs the micro-electromechanical process or the semiconductor process to integrate the thermoelectric cooling device and the LED module as a whole, thus enhancing the heatsinking ability and reducing the thermal resistance of the elements and the thermal contact resistance. As such, the performance of the LED and the service life of the LED element are improved.

Further, the present invention employs respectively fabricating the thermoelectric cooling device and the LED module on a silicon substrate, and then integrating the two substrates as a whole to form the LED package structure. Thus, the volume of the whole LED package structure can be reduced, and the process of fabricating the LED package structure can be simplified. The problem of low reliability caused by the bonding between different elements due to using adhesive agent in conventional technique can be avoided. Moreover, according to the present invention, the positioning portions can be respectively fabricated on the corresponding surfaces of the two substrates, thus enhancing the reliability for assembly of the two substrates by alignment of the positioning portions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an LED package structure, comprising:
   providing a first circuit substrate and a second circuit substrate, wherein the first circuit substrate has a first surface and a corresponding second surface, and the second circuit substrate has a third surface and a corresponding fourth surface, and the second surface and the third surface respectively have a plurality of electrodes;
   forming a plurality of N-type semiconductor materials and a plurality of P-type semiconductor materials, wherein the N-type semiconductor materials and the P-type semiconductor materials are alternatively arranged on the electrodes;
   assembling the first circuit substrate and the second circuit substrate, wherein the N-type semiconductor materials and the P-type semiconductor materials are located between the electrodes of the first circuit substrate and the second circuit substrate, and the N-type semiconductor materials and the P-type semiconductor materials are electrically connected to the first circuit substrate and the second circuit substrate through the electrodes; and
   arranging an LED chip on the first surface of the first circuit substrate, and making the LED chip electrically connected to the first circuit substrate.

2. The method of fabricating an LED package structure as claimed in claim 1, wherein the N-type semiconductor materials and the P-type semiconductor materials are respectively formed on the electrodes of the second surface of the first circuit substrate.

3. The method of fabricating an LED package structure as claimed in claim 1, wherein the N-type semiconductor materials and the P-type semiconductor materials are respectively formed on the electrodes of the third surface of the second circuit substrate.

4. The method of fabricating an LED package structure as claimed in claim 1, wherein a part of the N-type semiconductor materials and part of the P-type semiconductor materials are respectively formed on the electrodes of the second surface of the first circuit substrate, and a part of the N-type semiconductor materials and a part of the P-type semiconductor materials are respectively formed on the electrodes of the third surface of the second circuit substrate.

5. The method of fabricating an LED package structure as claimed in claim 1, wherein the second surface of the first circuit substrate further comprises a plurality of first positioning portions, and the third surface of the second circuit substrate further comprises a plurality of second positioning portions corresponding to the first positioning portions, and the first positioning portions and the second positioning portions are respectively located in the periphery of the electrodes.

6. The method of fabricating an LED package structure as claimed in claim 5, wherein the N-type semiconductor materials and the P-type semiconductor materials are respectively formed in the first positioning portions of the first circuit substrate and on the electrodes.

7. The method of fabricating an LED package structure as claimed in claim 5, wherein the N-type semiconductor materials and the P-type semiconductor materials are respectively formed in the second positioning portions of the second circuit substrate and on the electrodes.

8. The method of fabricating an LED package structure as claimed in claim 5, wherein a part of the N-type semiconductor materials and the P-type semiconductor materials is formed in the first positioning portions of the first circuit substrate, and a part of the N-type semiconductor materials and the P-type semiconductor materials is formed in the second positioning portions of the second circuit substrate.

9. The method of fabricating an LED package structure as claimed in claim 5, wherein when the first circuit substrate and the second circuit substrate are assembled, the first positioning portions are aligned with the second positioning portions, such that the N-type semiconductor materials and the P-type semiconductor materials are electrically connected to the electrodes on the first circuit substrate and the second circuit substrate.

10. The method of fabricating an LED package structure as claimed in claim 5, wherein the material of the first positioning portions and the second positioning portions is thick film photoresist.

11. The method of fabricating an LED package structure as claimed in claim 1, wherein the first surface and the second surface of the first circuit substrate respectively have an insulation layer, and the electrodes are located on the insulation layer of the second surface.

12. The method of fabricating an LED package structure as claimed in claim 1, wherein the first surface of the first circuit substrate has a groove for accommodating the LED chip.

13. The method of fabricating an LED package structure as claimed in claim 12, after the first circuit substrate and the second circuit substrate are provided, further comprising forming a reflective film in the groove.

14. The method of fabricating an LED package structure as claimed in claim 12, after the LED chip is electrically connected to the first circuit substrate, further comprising forming a molding compound on the first surface of the first circuit substrate, wherein the molding compound covers the LED chip.

15. The method of fabricating an LED package structure as claimed in claim 1, wherein the third surface of the second circuit substrate has an insulation layer, and the electrodes are located on the insulation layer of the third surface.

16. The method of fabricating an LED package structure as claimed in claim 1, after the first circuit substrate and the second circuit substrate are provided, further comprising respectively forming a solder on the electrodes of the first circuit substrate and the second circuit substrate.

17. The method of fabricating an LED package structure as claimed in claim 1, after the first circuit substrate and the second circuit substrate are provided, further comprising respectively forming a plurality of grooves on the second surface of the first circuit substrate, wherein the electrodes are respectively formed in the grooves.

18. The method of fabricating an LED package structure as claimed in claim 1, after the first circuit substrate and the second circuit substrate are provided, further comprising respectively forming a plurality of grooves on the third surface of the second circuit substrate, wherein the electrodes are respectively formed in the grooves.

19. The method of fabricating an LED package structure as claimed in claim 1, after the first circuit substrate and the second circuit substrate are provided, further comprising respectively forming a plurality of grooves on the second surface of the first circuit substrate and the third surface of the second circuit substrate, wherein the electrodes are respectively formed in the grooves.

20. The method of fabricating an LED package structure as claimed in claim 1, wherein a process for making the LED chip electrically connected to the first circuit substrate comprises a wire bonding technique or a flip-chip bonding technique.

21. The method of fabricating an LED package structure as claimed in claim 1, further comprising arranging a heatsink on the fourth surface of the second circuit substrate.

22. The method of fabricating an LED package structure as claimed in claim 1, wherein the step of providing the first circuit substrate and the second substrate further comprises:
    providing a first secondary substrate and a second secondary substrate, wherein the first secondary substrate has a groove and a carrier portion in the groove, and a surface of the second secondary substrate has the electrodes; and
    binding the first secondary substrate and the second secondary substrate by using the chip bonding technique, so as to form a first circuit substrate, wherein the carrier portion and the electrodes are respectively located on the two sides of the first circuit substrate.

23. The method of fabricating an LED package structure as claimed in claim 22, wherein the first secondary substrate and the second secondary substrate are respectively a silicon substrate.

24. The method of fabricating an LED package structure as claimed in claim 23, wherein the groove is formed on the first secondary substrate through etching the silicon substrate.

25. The method of fabricating an LED package structure as claimed in claim 23, wherein the groove penetrates a part of the first secondary substrate.

26. The method of fabricating an LED package structure as claimed in claim 22, wherein the LED chip is arranged on the carrier portion.

27. The method of fabricating an LED package structure as claimed in claim 22, after the LED chip is electrically connected to the first circuit substrate, further comprising forming a molding compound on the first secondary substrate, wherein the molding compound covers the LED chip.

28. The method of fabricating an LED package structure as claimed in claim 22, further comprising arranging a diffuser plate on the first circuit substrate, wherein the diffuser plate is located above the LED chip.

* * * * *